United States Patent [19]
Sandhu et al.

[11] Patent Number: 5,332,689
[45] Date of Patent: Jul. 26, 1994

[54] METHOD FOR DEPOSITING LOW BULK RESISTIVITY DOPED FILMS

[75] Inventors: Gurtej S. Sandhu; Charles L. Turner, both of Boise, Id.

[73] Assignee: Micron Technology, Inc., Boise, Id.

[21] Appl. No.: 18,632

[22] Filed: Feb. 17, 1993

[51] Int. Cl.$^5$ .......................................... H01L 21/70
[52] U.S. Cl. ................................. 437/109; 437/168; 437/967; 148/DIG. 38
[58] Field of Search ............ 437/81, 82, 108, 109, 437/160, 161, 162, 165, 166, 168, 233, 234, 967; 148/DIG. 30, DIG. 37, DIG 38, DIG. 41, DIG. 57, DIG. 122

[56] References Cited

U.S. PATENT DOCUMENTS

| | | | |
|---|---|---|---|
| 4,370,510 | 1/1983 | Stirn | 136/262 |
| 4,441,249 | 4/1984 | Alspector et al. | 437/233 |
| 4,866,003 | 9/1989 | Yokoi et al. | 437/241 |
| 4,916,089 | 4/1990 | Van Suchtelen et al. | 437/81 |
| 4,963,506 | 10/1990 | Liow et al. | 437/108 |
| 4,988,640 | 1/1991 | Bohling et al. | 437/967 |
| 5,116,784 | 5/1992 | Ushikawa | 437/233 |
| 5,141,892 | 8/1992 | Beinglass | 437/233 |

FOREIGN PATENT DOCUMENTS

| | | | |
|---|---|---|---|
| 0138332 | 8/1984 | Japan | 437/162 |
| 0295644 | 12/1986 | Japan | 437/162 |

OTHER PUBLICATIONS

Translation of Hosaka-JP 59-138332 (English).

Primary Examiner—Tom Thomas
Assistant Examiner—Chandra Chaudhori
Attorney, Agent, or Firm—Stephen A. Gratton

[57] ABSTRACT

An LPCVD deposition process for depositing doped thin films on a substrate is provided. The process may be performed in a LPCVD reaction chamber at elevated temperatures and reduced pressures. The process is especially suited to the deposition and doping of chemically incompatible deposition species and dopants such as polysilicon and arsenic. A deposition gas (e.g. silane) and a dopant gas (e.g. arsine) are thermally decomposed in the reaction chamber. During the deposition process the gas flows are pulsed relative to one another in some manner. This pulsed gas flows form a multi-layer stack which includes alternating deposition layers and doping layers. The dopants in the doping layer are then diffused during a subsequent annealing step (or during subsequent processing) into the deposition layers to form a uniformly doped thin film.

10 Claims, 1 Drawing Sheet

METHOD FOR DEPOSITING LOW BULK RESISTIVITY DOPED FILMS

FIELD OF THE INVENTION

This invention relates to semiconductor manufacture and more particularly to a novel method for forming doped films and particularly arsenic doped polysilicon films having a low bulk resistivity.

BACKGROUND OF THE INVENTION

In the formation of integrated circuit devices (ICs), a semiconducting substrate (e.g. silicon) is subjected to a series of chemical and thermal process steps to modify the electrical properties of certain areas of the substrate. Doping is the process of placing specific amounts of dopant atoms into the crystal lattice structure of the substrate or a film deposited on the substrate. In general, the electrical characteristics (e.g. conductivity, resistivity) of a defined region of a semiconductor structure are a function of the concentration and depth of the dopants in that region. In order to obtain electrical devices having predictable and reliable electrical characteristics, a doping process must be accurately controlled to provide an optimal concentration and depth for dopant atoms within the substrate.

One common method of doping is by low pressure chemical vapor deposition (LPCVD). With an LPCVD doping process, a deposition gas and a dopant gas are supplied to a process chamber of CVD reactor. A substrate to be doped and the process chamber are maintained at relatively high temperatures and low pressures. In the process chamber, the deposition gas and the dopant gas thermally decompose and deposit onto the substrate. The deposited film is thus a mixture of a deposition species and a dopant species. Following the deposition process, an annealing step is used to drive the dopant atoms into the crystal lattice structure of the deposited film. The dopant atoms move by filling empty crystal positions (i.e. vacancies) or alternately move through the spaces between the crystal sites (i.e. interstitial).

As an example of a prior art LPCVD doping process, polysilicon thin films may be deposited along with a dopant on a silicon substrate. A suitable deposition gas for depositing polysilicon is silane. In general, the silane decomposes under the vacuum and the high temperature of the process chamber and deposits onto the substrate. Common dopants for polysilicon include phosphorous, boron, and arsenic. Common dopant gases for use in an LPCVD doping process include phosphine ($PH_3$), diborane ($B_2H_6$), and arsine ($ASH_3$).

Although all of the above noted dopants are important in semiconductor manufacture, the use of arsenic as a dopant in semiconductor manufacture is becoming increasingly important. This is because arsenic doped films, in some instances, exhibit characteristics that are more suitable to the formation of particular semiconductor devices than phosphorus or boron doped films. As an example, the diffusion of arsenic into silicon is an order of magnitude slower than the diffusion of phosphorus into silicon. Diffusion of dopant atoms into areas where they would have a detrimental effect on other device components is thus much easier to control with arsenic as a dopant rather than phosphorus.

There are however, several problems associated with the deposition of arsenic doped films. A major problem with an arsenic doped film deposited with a conventional LPCVD method is that the resistivity of the deposited film is extremely high. As an example, even with a high concentration of arsenic incorporated into the as deposited films (up to $1E20/cm^3$) the bulk resistance (Rb) of the film remains high. Further annealing steps reduce the bulk resistance of the deposited films to some extent, but the bulk resistance is still higher than expected for a given level of dopant incorporation.

It is theorized by the present inventors that such a high bulk resistance may result because arsenic in the deposited film is not electrically active. Incorporation of arsenic causes a large amount of microscopic strain in the films and creates microscopic defects. These defects make it difficult to activate arsenic atoms as charge carriers or to compensate for the charge carriers generated by the activated arsenic atoms. A high resistance film thus results. Moreover, the solid solubility limit of arsenic in silicon is an order of magnitude higher than phosphorus in silicon. This property combined with the slower diffusion rate of arsenic into silicon provides less arsenic at the grain boundaries. Again the net result is a higher resistance.

Another problem associated with the LPCVD deposition of arsenic doped polysilicon is that in general, the surface of a deposited film is very rough. Under the process conditions that are most suitable for depositing a low resistivity film, a filament type growth is initiated in the deposited film. Such a rough filamentary growth affects the properties of the deposited film and detracts from the quality and adhesion of subsequently deposited film layers.

Yet another problem associated with the LPCVD deposition of an arsenic doped polysilicon film, is that the deposition rate for depositing such a film is limited. This is because the deposition chemistry for depositing these species is incompatible. The arsenic dopants effectively poison the substrate surface and inhibit further chemical reaction. This drastically lowers the film deposition rate so that long process times are required. Such large process times are unacceptable in a large scale semiconductor manufacturing process.

As is apparent from the foregoing discussion, there is a need in the semiconductor art for an improved LPCVD deposition process for depositing doped films on a substrate. In particular, there is a need for a film deposition process for films and dopant species which have incompatible chemistries (e.g. polysilicon and arsenic) and in which the substrate surface is poisoned by one of the species.

Accordingly, it is an object of the present invention to provide a novel LPCVD method for forming doped thin films and in particular arsenic doped polysilicon films. It is a further object of the present invention to provide a method for forming doped films and particularly arsenic doped polysilicon films that are characterized by a low bulk resistance, a fine grain structure and a smooth surface. It is yet another object of the present invention to provide a method for forming doped films and particularly arsenic doped polysilicon films in which a deposition rate is high and which is suitable to large scale semiconductor manufacture.

SUMMARY OF THE INVENTION

In accordance with the present invention, a method for forming a doped thin film such as arsenic doped polysilicon is provided. The method of the invention is performed in an LPCVD reaction chamber at elevated temperatures and reduced pressures. In the reaction chamber, a deposition gas and a dopant gas are thermally decomposed and deposited onto a substrate. In accordance with the method of the invention, the deposition gas and the dopant gas are pulsed in some manner relative to one another. The pulsed gas flows alternately deposit a deposition film layer followed by a dopant film layer. This forms a stacked or multi-layer structure of alternating layers (deposition layer/dopant layer). The dopant layer may be formed as either a pure dopant species or as a layer of the deposition species having a high concentration of the dopant species.

During a subsequent annealing step such as a rapid thermal anneal (RTA) or furnace anneal, each deposition film layer is doped by dopant diffusion from an adjacent dopant film layer. Since each deposition film layer is doped from either side, the dopant atoms need only travel half the distance. Stated differently, the doping takes place from two interfaces thereby reducing the required diffusion distance by one half. This speeds up the diffusion process and the deposition process in general. In addition, a very low thermal budget is required for the diffusion process. In some applications an annealing step can be entirely eliminated, as the thermal budget encountered during subsequent processing of the substrate will be sufficient to activate diffusion of the dopant species into the deposition film layer.

In an illustrative embodiment of the invention, polysilicon is doped with arsenic. In the LPCVD process of the invention, flows of a silane deposition gas and an arsine dopant gas are pulsed. Pulsing can be defined as turning the gas flows completely on and off or as varying the flow rate or relative concentrations of the different gases.

As an example, pulsing can be accomplished by turning the flow of the silane or the arsine dopant gas either on or off. When the silane is on, the arsine is off, and vice versa. With this type of pulsing, there is no intermixing of the deposition and dopant gases. This results in the formation of a stacked structure that includes a pure polysilicon film layer followed by a pure arsenic film layer.

Alternately, the silane gas flow can be kept constant and the arsine gas flow pulsed on and off. This produces a stacked structure that includes pure polysilicon deposition film layers interfacing with mixed species polysilicon/arsenic doping film layers. Pulsing can also be accomplished by varying the flow rates or relative concentrations of the different gas species. This type of pulsing can also be used to produce a stacked structure with doping layers comprised of polysilicon/arsenic layers having a varying relative concentration of arsenic to silicon atoms.

Regardless of which method of pulsing is utilized, during a subsequent annealing step (or during subsequent processing) the arsenic atoms from the dopant layers will diffuse into the different polysilicon layers of the stacked structure and form a uniformly doped polysilicon stack. The key to the process is the formation of very thin film layers. The dopant atoms will thus have a small distance to travel to complete the diffusion process. The process parameters can thus be adjusted to achieve film layers of a desired thickness and of a desired dopant concentration. The thickness of each layer in the stack can be optimized from a few angstroms to several hundred angstroms. In addition, such a multilayer stack may include several individual film layers (e.g. ten) to produce a desired overall doped film thickness.

Doped films can be deposited in accordance with the invention with a very low resistivity. In addition, the doped films will be smoother than conventional LPCVD doped films and can be formed with a controlled grain growth. Moreover, since the thermal budget required to activate the dopant diffusion is very low, no extra annealing needs to be performed.

Other objects, advantages and capabilities of the present invention will become more apparent as the description proceeds.

BRIEF DESCRIPTION OF THE INVENTION

FIG. 1 is a schematic view of a substrate having film layers deposited thereon in accordance with the pulsed gas flow LPCVD method of the invention; and FIG. 2 is a schematic view of alternating film layers deposited in accordance with the pulsed gas flow LPCVD method of the invention and showing the diffusion of dopants from a dopant layer into an adjacent deposition film layer.

DETAILED DESCRIPTION OF THE INVENTION

Figure 1:
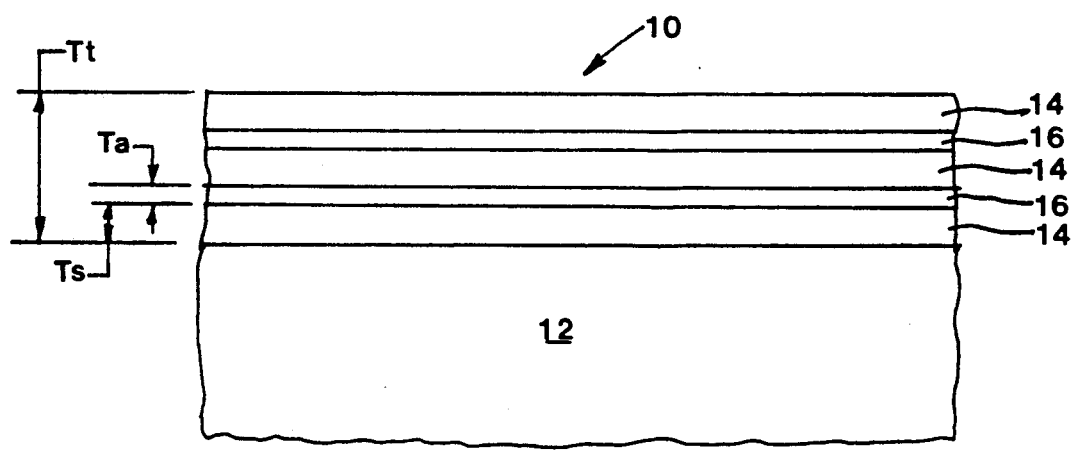

The method of the invention, broadly stated, is an LPCVD process in which a deposition species and a dopant species are deposited in alternating thin film layers on a substrate. During an annealing step (or during subsequent processing) the dopant atoms diffuse into the adjacent deposition film layers to provide a uniformly doped film having a low resistivity, a smooth surface and a fine grain size. In general, both the deposition species and the dopant species films are deposited in very thin layers. The dopant species film layers, however are much thinner than the deposition species film layers.

Stated in more detail, the method of the invention includes the following steps.

1. Placing a substrate in a LPCVD reaction chamber.
2. Maintaining the reaction chamber under vacuum pressure and elevated temperatures. This may be done by heating the substrate and gases within the reaction chamber.
3. Introducing a deposition gas into the reaction chamber for depositing a film layer onto the substrate.
4. Introducing a dopant gas into the reaction chamber for depositing dopants or a dopant film layer onto the substrate.
5. Pulsing the deposition gas flow (i.e. on and off) alternately with the dopant gas flow such that the gases do not intermix and a stacked structure comprising alternating layers of a pure deposition film and a pure dopant film are formed on the substrate.
5a. Alternately, the deposition gas flow may remain constant throughout the process and the dopant gas flow can be pulsed on and off to form a stacked structure comprising alternating layers of a pure deposition film and a doped deposition film. This may also be accomplished by varying the concentration of the dopant gas relative to the deposition gas.
6. Diffusing the dopants throughout the stacked structure to provide a uniformly doped film layer. This may be done using a rapid thermal anneal (RTA), by the high temperatures encountered during subsequent process of the substrate or by furnace annealing.

In an illustrative embodiment of the invention, a polysilicon thin film is deposited on a silicon substrate and doped with arsenic. The process can be carried out in a hot wall LPCVD reactor (i.e. tube furnace) at elevated temperatures (400° C.–700° C.) and reduced pressures. Under these conditions a silicon deposition gas such as silane ($SiH_4$) will reduce by thermal decomposition and a thin film of polysilicon will deposit on the exposed portions of the substrate. Other silicon source gases such as disilane ($Si_2H_6$) and dichlorosilane ($SiH_2Cl_2$) would also be suitable for use as a deposition gas. In addition, organosilicon compounds such as hexamethyldisilazane (HMDS), dimethyldichlorosilane (DMDCS), and trimethylchlorsilane (TMCS) would also be suitable.

In accordance with the invention, the flow of the silicon deposition gas is alternated or pulsed with an arsenic doping gas. A suitable arsenic doping gas is arsine. Other suitable arsenic doping gas include tertiary butyl arsine ($H_2As[t-C_4H_9]$), diethlarsine ($HAs[C_2H_5]_2$), and trimethylarsine ($As[CH_3]_3$). The arsenic doping gas will also undergo thermal decomposition in the LPCVD reaction chamber and a thin film of arsenic or simply arsenic atoms will deposit on the substrate.

In a first embodiment of the invention, both the silicon deposition gas (silane) and the arsenic doping gas (arsine) can be pulsed on and off. With this situation there will be no intermixing of the different gas species. With each silane gas pulse a pure single species film of polysilicon will deposit on the substrate. With each arsine gas pulse a pure single species film of arsenic will deposit on the substrate.

The duration of a pulse will be from several seconds to several minutes. A thickness of the deposited films will be from a few angstroms to several hundred angstroms. Since the number of arsenic atoms in the doped polysilicon will be several orders of magnitude (i.e. $10^2$–$10^4$) less than the number of silicon atoms in the doped polysilicon film, however, the deposited arsenic film will be much thinner than the deposited polysilicon film. As an example, the polysilicon films may be 10–1000 thicker than the arsenic films. Depending on the process conditions, the duration of the arsenic deposition pulses will be proportionately less than the duration of the polysilicon deposition pulses.

Alternately, instead of pulsing the silicon deposition gas on and off, the silicon deposition gas may remain on throughout the process and just the arsenic doping gas can be pulsed on and off or varied in concentration. In this case, a pure single component arsenic film will not be produced. The deposited films will be either all polysilicon or a mixture of polysilicon and arsenic.

In either case the arsenic will diffuse throughout the polysilicon during a subsequent annealing step (or during subsequent processing if there is no annealing). As an example, annealing can be performed for a time period of from about 15 minutes to several hours and at a temperature of from about 800° C.–1200° C. for a silane chemistry. In general, disilane and other chemistries may require lower annealing temperatures.

Referring now to FIG. 1, a semiconductor structure 10 includes a silicon substrate 12. In accordance with the method of the invention, the substrate is placed in an LPCVD reaction chamber. With a pulsed gas supply, layers of polysilicon 14 (deposition layer) are alternately deposited with layers of arsenic 16 (doping layer). Each layer of polysilicon 14 has an interface layer of arsenic 16 on either side. The process is controlled such that a thickness Ts of each polysilicon layer 14 is greater than a thickness Ta of each arsenic layer 16.

If the silicon deposition gas is pulsed on and off in an opposite phase with an on and off pulsing of the arsenic doping gas, there will be no intermixing of the gas. In that case, the deposited polysilicon layers 14 will be pure polysilicon. Likewise the arsenic layers 16 deposited will be pure arsenic.

On the other hand, if the silicon deposition gas is continuously supplied and the arsenic doping gas is pulsed on and off, the arsenic layers 16 will not be pure arsenic but will be polysilicon with a high concentration of arsenic atoms. In either case the phase of the gas pulses and duty cycle (i.e time period that a pulse is pure silicon source or pure arsenic source) can be regulated to obtain a desired thickness Ts for the polysilicon layers 14, a desired thickness Ta for the arsenic layers, a desired total film thickness Tt, and a desired arsenic concentration.

Figure 2:
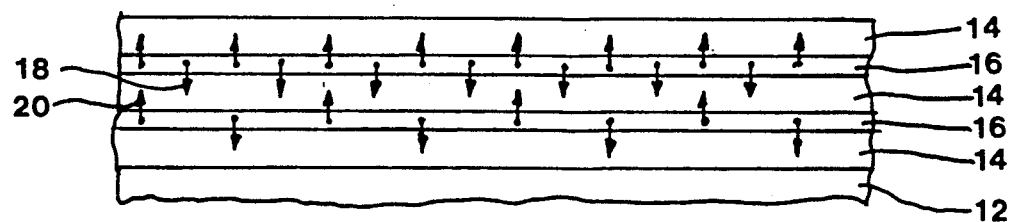

With reference to FIG. 2, during an annealing step (or subsequent processing) the arsenic atoms will diffuse in two directions. Each polysilicon layer 14 (deposition layer) will then receive arsenic atoms along two interface layers. The directional arrows 18, 20 indicate the directions of diffusion of arsenic atoms from the arsenic layers 16 (doping layers) into the polysilicon layers 14. This in effect decreases the distance that the arsenic atoms must diffuse by 50%. Further, the different layers 14, 16 can be formed to achieve a stack of a total thickness Tt (FIG. 1) having a uniform concentration of arsenic dopant atoms. In other words, arsenic concentration is not a function of the depth from the substrate surface as with prior art LPCVD doping processes.

A key requirement of the process is that the deposited film layers 14, 16 be thin enough to keep the diffusion distances relatively short. Representative thickness for the polysilicon layers 14 Ts are in the range of about 100 Å to about 1000 Å. Representative thicknesses for the arsenic layers 16 are in the range of about 5 Å to about 50 Å. A representative ratio of Ta to Ts is about 1 to 2 to about 1 to 200. With thin film layers a relatively fast rate of diffusion will occur. Moreover, a thermal budget or energy input required to effect the diffusion is also relatively low.

Moreover, a rate of deposition of an arsenic doped polysilicon film of a total thickness of Tt (FIG. 1) is faster than a deposition rate of an arsenic doped polysilicon film of equal thickness formed with a prior art LPCVD processes. In general, this is because with the pulsed process of the invention, arsenic poisoning of the substrate surface is less likely to occur and will not continue throughout the process. As previously explained, arsenic and silicon, in general, have incompatible deposition chemistries. The deposition rate of an arsenic doped polysilicon layer formed with a conventional LPCVD process is thus adversely affected by arsenic poisoning of the deposition surface.

An arsenic doped polysilicon film of a total thickness Tt deposited in accordance with the invention is characterized by a fine grain structure and a smooth surface. In addition, the resistivity of the deposited film is extremely low. As an example, with the process of the present invention sheet resistance in the range of 30 ohms/square to 100 ohms/square can be obtained. Further, since the undoped polysilicon films are grown at a much faster rate, as compared to deposition of conventional LPCVD doped arsenic films, process times are reduced.

Example

An LPCVD process was carried out in a hot wall CVD reactor (i.e. tube furnace). Polysilicon films doped with arsenic were deposited on a silicon substrate. Silane was used as a deposition gas for depositing silicon. Arsine was used as a doping gas for depositing arsenic as a dopant. Both the silane and the arsine were pulsed on and off in opposite phase so that there was no intermixing of the gases.

The following process conditions were utilized:

| | |
|---|---|
| Deposition temperature | 600° C. |
| Vacuum Pressure | 120 mTorr silane pulse |
| | 100 mTorr arsine pulse |
| Silane Flow Rate | 150 sccm |
| Silane Pulse Duration | 600 seconds |
| Arsine Flow Rate | 70 sccm |
| Boat Load | 80 wafers |

Such a process produced an arsenic concentration of $2e^{19}/cm^3$. Following LPCVD deposition of alternating pure silicon and pure arsenic layers, the wafers were annealed using a rapid thermal anneal (RTA) at 982° C. for 30 minutes in a nitrogen ambient.

Table 1 is a compilation of the characteristics of the film obtained from this process.

TABLE I

| | Wafer Position in Boat | | |
|---|---|---|---|
| | TOP | CENTER | BOTTOM |
| Average Film Thickness (A) | 1130 | 1078 | 1175 |
| Average Sheet Resistance (ohms/sq) | 1587 | 1743 | 1389 |
| Across Wafer Thickness Uniformity (%) | 0.4 | 0.7 | 0.7 |
| Across Wafer Sheet Resistance Uniformity (%) | 1.5 | 4.0 | 3.0 |
| Wafer-to-Wafer Thickness Uniformity (%) | 4.3 | | |
| Wafer-to-Wafer Resistivity Uniformity (%) | 7.2 | | |

All uniformities are expresed as standard deviations using a three sigma sorting factor.

The deposited films were characterized by a smooth surface, a uniform grain size and much lower resistivity than films doped with a conventional LPCVD process.

Thus the method of the invention provides an LPCVD deposition method for films and dopants having incompatible chemistries. Although the invention has been described in terms of a preferred embodiment for doping polysilicon with arsenic, the method of the invention is also suitable for the deposition and doping of other film materials and dopants. Thus, it is intended that alternate embodiments of the inventive concepts expressed herein be contained within the scope of the following claims.

What is claimed is:

1. In semiconductor manufacture an LPCVD method for forming an arsenic doped polysilicon thin film having a low bulk resistivity on a substrate, comprising:
    placing the substrate in a LPCVD reaction chamber;
    maintaining the substrate and the reaction chamber under a vacuum pressure;
    introducing and thermally decomposing a silicon deposition gas in the reaction chamber for depositing a polysilicon deposition film layer on the substrate;
    introducing and thermally decomposing an arsenic dopant gas in the reaction chamber for depositing an arsenic film layer on the substrate;
    pulsing the silicon deposition gas flow and the arsenic dopant gas flow by switching the silicon deposition gas and the arsenic dopant gas on and off in opposite phase so that arsenic will not poison the deposition of the polysilicon film layer such that a multilayer stack is formed including single species polysilicon film layers and single species arsenic film layers; and
    diffusing arsenic dopants from the arsenic film layers into the polysilicon film layers such that a uniformly doped film layer is formed.

2. The method as claimed in claim 1 and wherein the deposition film layers are thicker than the dopant film layers.

3. The method as claimed in claim 2 and wherein the reaction chamber is an LPCVD reactor.

4. The method as claimed in claim 3 and wherein the deposition gas is silane and the dopant gas is arsine.

5. The method as claimed in claim 4 and wherein the substrate and reaction chamber are at a temperature of about 400° C.-700° C.

6. The method as claimed in claim 5 and wherein the deposition film layers have a thickness of 100 Å to 1000 Å and the dopant film layers have a thickness of 5 Å to 50 Å.

7. In a semiconductor manufacture an LPCVD method for forming an arsenic doped polysilicon thin film having a low bull resistivity on a substrate, comprising:
    placing the substrate in a LPCVD reaction chamber;
    maintaining the substrate and the reaction chamber under a vacuum pressure;
    introducing a silicon deposition gas flow into the reaction chamber for depositing a polysilicon film layer on the substrate;
    introducing an arsenic dopant gas flow into the reaction chamber for depositing an arsenic layer on the substrate;
    pulsing the silicon deposition gas flow on and off and pulsing the arsenic deposition gas flow on and off in opposite phase so that arsenic will not poison the deposition of the polysilicon film layer such that a multi-layer stack is formed including single species polysilicon layers and single species arsenic layers with the arsenic layers relatively thinner than the polysilicon layers; and
    diffusing arsenic from the arsenic containing film layers into the polysilicon film layers such that a uniformly doped polysilicon film layer is formed.

8. The method as claimed in claim 7 and wherein diffusing the arsenic is by rapid thermal annealing (RTA).

9. The method as claimed in claim 7 and wherein the silicon deposition gas is selected from the group consisting of silane, disilane, dichlorosilane, hexamethyldisilazane, dimethyldichlorosilane and trimethylchlorsilane.

10. The method as claimed in claim 7 and wherein the arsenic dopant gas is selected from the group consisting of arsine, tertiary butyl arsine, diethlarsine and trimethylarsine.

* * * * *